United States Patent
Kageyama et al.

(10) Patent No.: US 11,725,796 B2
(45) Date of Patent: Aug. 15, 2023

(54) LIGHT-EMITTING MODULE, VEHICLE LAMP, AND HEAT DISSIPATION MEMBER

(71) Applicant: NICHIA CORPORATION, Anan (JP)

(72) Inventors: Yoshiyuki Kageyama, Tokushima (JP); Kenji Ozeki, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/851,161

(22) Filed: Jun. 28, 2022

(65) Prior Publication Data

US 2023/0003361 A1 Jan. 5, 2023

(30) Foreign Application Priority Data

Jun. 30, 2021 (JP) .................................. 2021-109146

(51) Int. Cl.
*F21S 45/47* (2018.01)
*F21S 41/141* (2018.01)

(52) U.S. Cl.
CPC ............. *F21S 45/47* (2018.01); *F21S 41/141* (2018.01)

(58) Field of Classification Search
CPC ..... F21Y 2115/10; F21S 41/141; F21S 43/14; F21S 45/47; F21V 29/70; F21V 29/87; F21V 29/83; F21V 29/85; F21V 29/503; F21W 2102/00; F28F 21/02; F28F 21/062; F28F 2245/06; C08J 5/043
See application file for complete search history.

(56) References Cited

U.S. PATENT DOCUMENTS

| | | | |
|---|---|---|---|
| 2007/0278212 A1 | 12/2007 | Okimura | |
| 2008/0089069 A1* | 4/2008 | Medendorp | F21V 29/763 362/294 |
| 2009/0095461 A1 | 4/2009 | Lemak et al. | |
| 2009/0251864 A1* | 10/2009 | Saga | F21V 29/717 361/704 |
| 2012/0152510 A1 | 6/2012 | Noda et al. | |
| 2015/0253089 A1 | 9/2015 | Fan et al. | |

FOREIGN PATENT DOCUMENTS

| | | |
|---|---|---|
| CN | 110402064 A1 | 11/2019 |
| JP | 2008-028352 A | 2/2008 |
| JP | 2010-251466 A | 11/2010 |

(Continued)

OTHER PUBLICATIONS

Search English translation of KR 20170021023 A (Year: 2017).*

*Primary Examiner* — Omar Rojas Cadima
(74) *Attorney, Agent, or Firm* — Foley & Lardner LLP

(57) ABSTRACT

A light-emitting module includes a first substrate, a heat dissipation member, a second substrate, and a light-emitting element. The heat dissipation member is disposed on the first substrate. The second substrate is disposed on the heat dissipation member. The light-emitting element is disposed on a lower surface of the first substrate or an upper surface of the second substrate. The heat dissipation member includes a graphite member and a metal member. The graphite member has a first surface facing the first substrate and a second surface located opposite to the first surface. The graphite member has a first groove extending in a first direction in the first surface. The metal member includes a first internal metal member disposed in the first groove.

20 Claims, 9 Drawing Sheets

(56) References Cited

FOREIGN PATENT DOCUMENTS

| | | | |
|---|---|---|---|
| JP | 2010-538493 A | | 12/2010 |
| JP | 2012-069670 A | | 4/2012 |
| JP | 2012-142547 A | | 7/2012 |
| JP | 2014-197608 A | | 10/2014 |
| JP | 2015-532531 A | | 11/2015 |
| JP | 2017-112334 A | | 6/2017 |
| JP | 2018-206840 A | | 12/2018 |
| JP | 2021-100006 A | | 7/2021 |
| KR | 20170021023 A | * | 2/2017 |
| WO | WO-2014/052282 A1 | | 4/2014 |
| WO | WO-2019/188614 A1 | | 10/2019 |
| WO | WO-2020/059605 A1 | | 3/2020 |

* cited by examiner

LIGHT-EMITTING MODULE, VEHICLE LAMP, AND HEAT DISSIPATION MEMBER

CROSS-REFERENCE TO RELATED APPLICATION

This application claims priority to Japanese Patent Application No. 2021-109146, filed on Jul. 30, 2021, the disclosure of which is hereby incorporated by reference in its entirety.

BACKGROUND

Certain embodiments relate to a light-emitting module, a vehicle lamp, and a heat dissipation member.

Light-emitting elements have increased the light emission amount and are mounted at high density, year by year, to thereby increase heat generation (See, for example, PCT Publication No. WO 2014/052282). Therefore, light-emitting modules need a countermeasure against heat.

SUMMARY

An object of certain embodiments of the present disclosure is to provide a light-emitting module, a vehicle lamp, and a heat dissipation member that allow for improving reliability.

According to one embodiment, a light-emitting module includes a first substrate, a heat dissipation member, a second substrate, and a light-emitting element. The heat dissipation member is disposed on the first substrate. The second substrate is disposed on the heat dissipation member. The light-emitting element is disposed on a lower surface of the first substrate or an upper surface of the second substrate. The heat dissipation member includes a graphite member and a metal member. The graphite member has a first surface facing the first substrate and a second surface located opposite to the first surface. The graphite member has a first groove extending in a first direction in the first surface. The metal member includes a first internal metal member disposed in the first groove.

According to another embodiment, a vehicle lamp includes the light-emitting module described above.

According to another embodiment, a heat dissipation member includes a graphite member and a metal member. The graphite member has a first surface and a second surface opposite to the first surface. The graphite member has a first groove extending in a first direction in the first surface. The metal member includes a first internal metal member disposed in the first groove.

Certain embodiments of the present disclosure can provide a light-emitting module, a vehicle lamp, and a heat dissipation member that allow for improving reliability.

DETAILED DESCRIPTION

Structure

The constitution of a light-emitting module according to certain embodiments will be described below referring to the accompanying drawings. Sizes or positional relationships of components illustrated in each drawing may be exaggerated in order to clarify the descriptions. Dimensions or positions of each member in a plan view and the corresponding cross-sectional view may not be strictly consistent. The illustration of components may be partly omitted to prevent the drawings from being too complicated, and cross-sectional views may be cross-sectional end views showing only cross sections of members.

Figure 1:
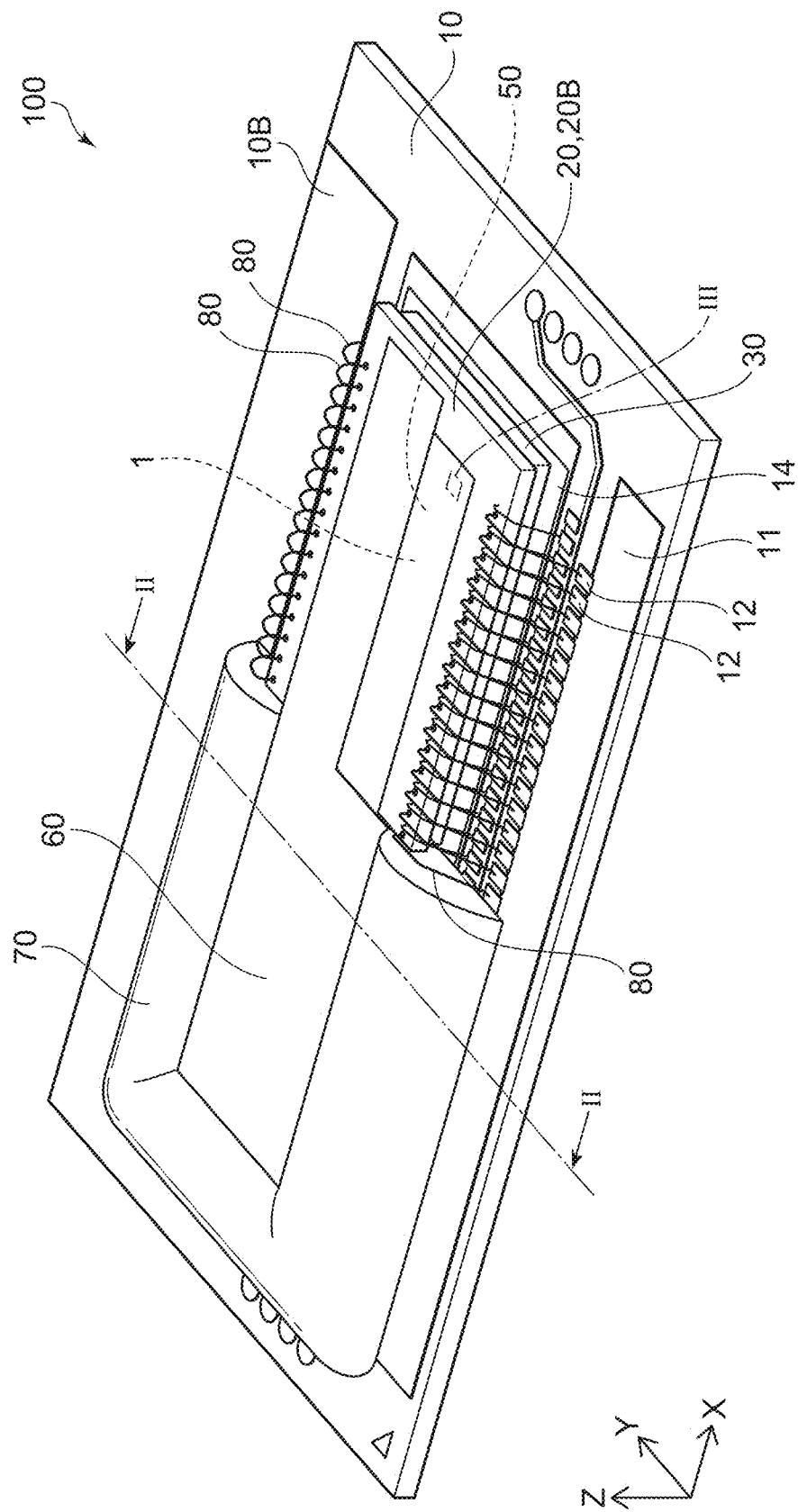
FIG. 1 is a schematic perspective view of a light-emitting module according to the present embodiment viewed obliquely from above.

FIG. 1 is a schematic perspective view of the light-emitting module according to the present embodiment viewed obliquely from above.

Figure 2:
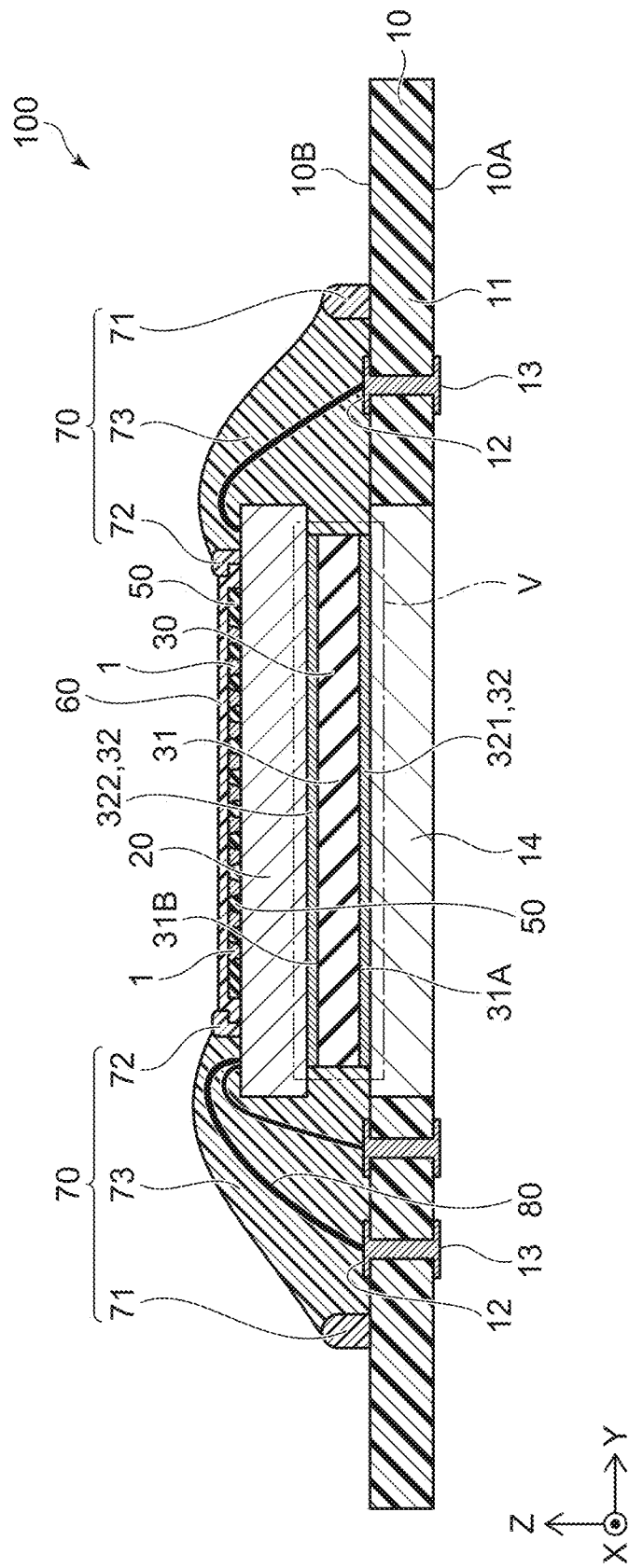
FIG. 2 is a schematic cross-sectional view taken along the line II-II of FIG. 1.

FIG. 2 is a schematic cross-sectional view taken along the line II-II of FIG. 1.

Figure 3:
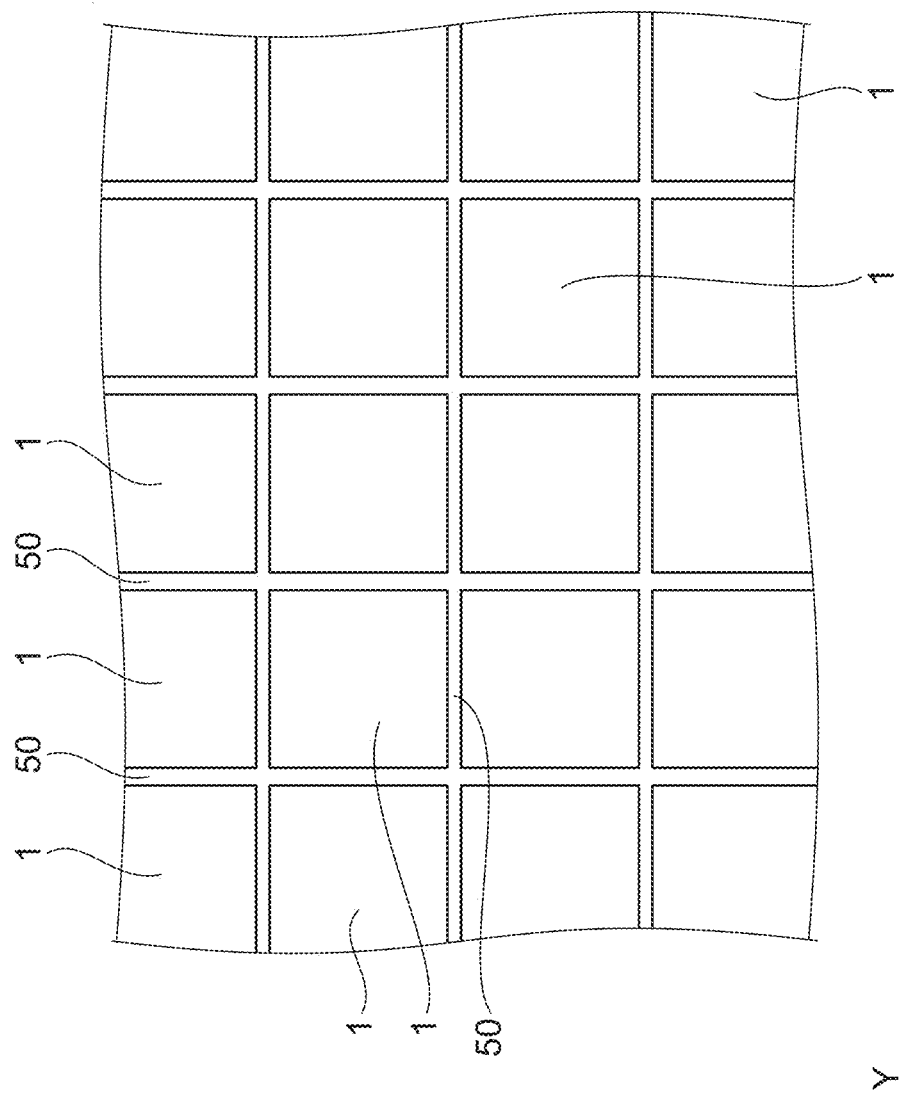
FIG. 3 is a schematic enlarged plan view of the region III in FIG. 1.

FIG. 3 is a schematic enlarged plan view of the region III in FIG. 1.

Figure 4:
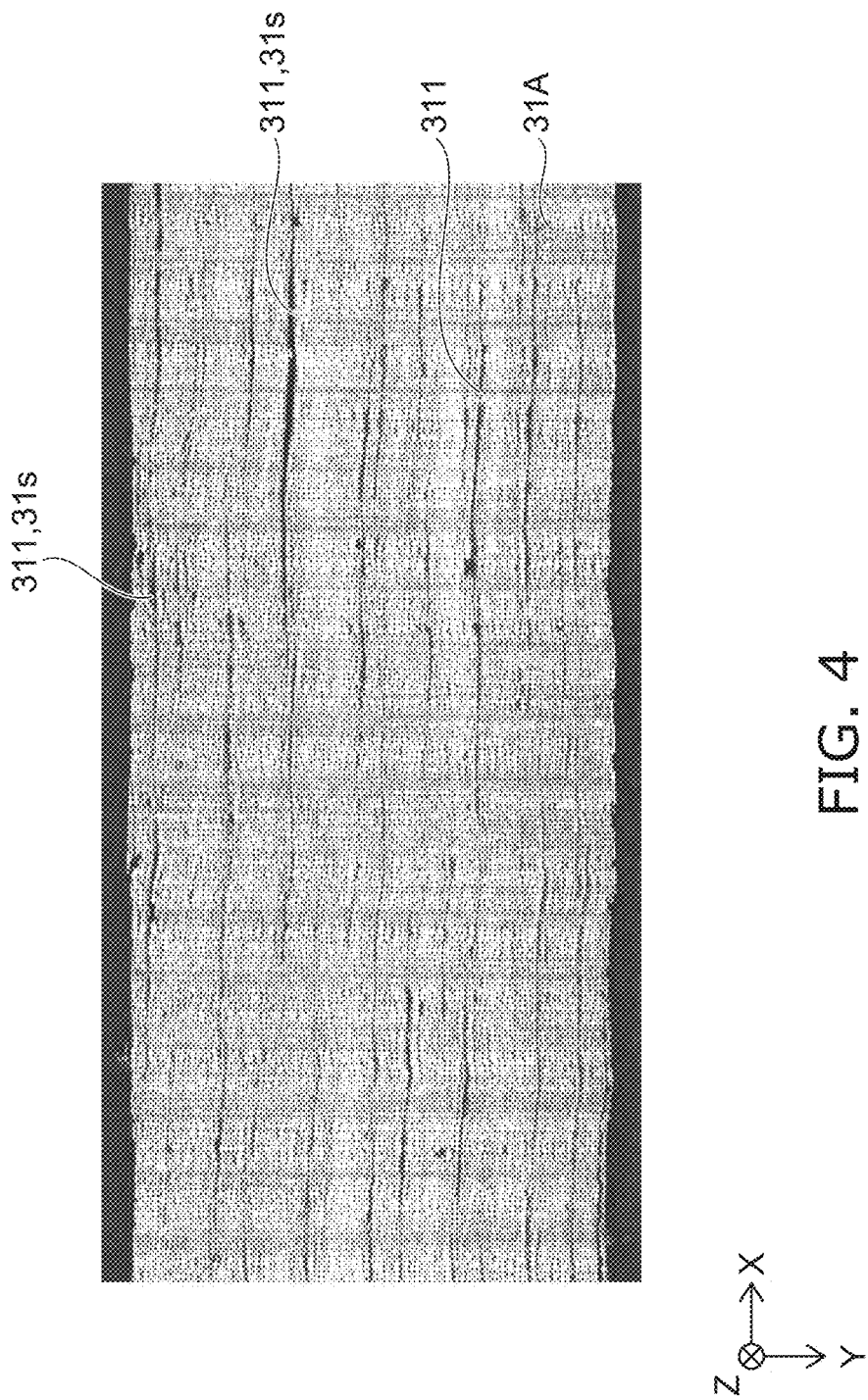
FIG. 4 is a photograph substituting for a drawing illustrating a lower surface of a graphite member.

FIG. 4 is a photograph substituting for a drawing illustrating a lower surface of a graphite member.

Figure 5:
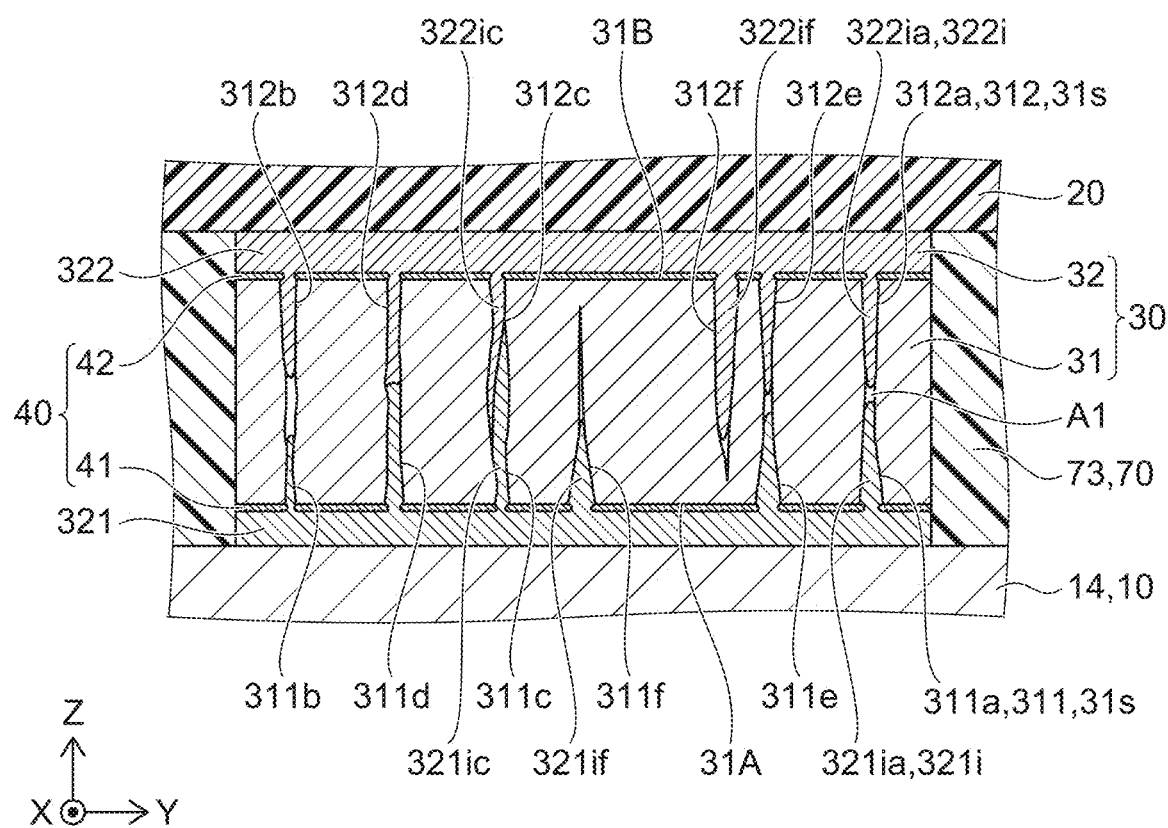
FIG. 5 is a schematic enlarged cross-sectional view of the region V in FIG. 2.

FIG. 5 is a schematic enlarged cross-sectional view of the region V in FIG. 2.

Figure 6:
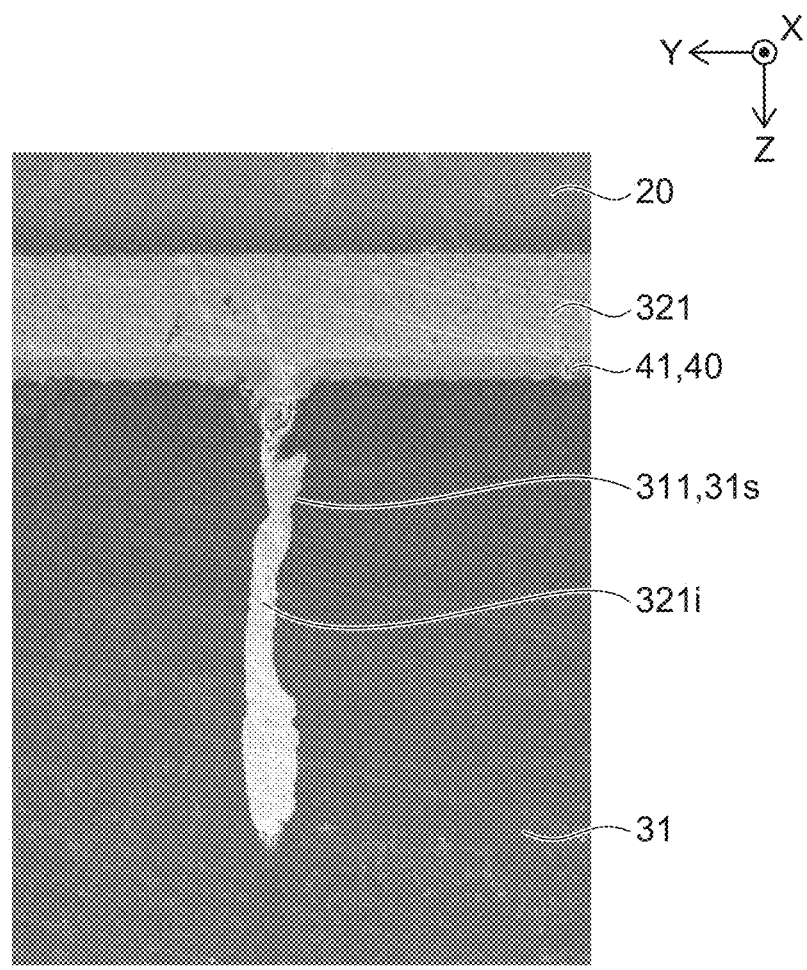
FIG. 6 is a photograph substituting for a drawing illustrating a cross section of an upper portion of a heat dissipation member.

FIG. 6 is a photograph substituting for a drawing illustrating a cross section of an upper portion of a heat dissipation member.

For example, a light-emitting module 100 according to the present embodiment is used as a light source of a vehicle lamp such as a vehicle headlight. As shown in FIG. 1 and FIG. 2, the light-emitting module 100 according to the present embodiment includes light-emitting elements 1, a supporting substrate 10 (corresponding to a first substrate or a second substrate in the claims), a wiring substrate 20 (corresponding to the second substrate or the first substrate in the claims), a heat dissipation member 30, a reflective member 50, a wavelength conversion member 60, a protective member 70, and a plurality of wires 80. For example, the wiring substrate 20 corresponds to the second substrate in the case in which the supporting substrate 10 corresponds to the first substrate, and the wiring substrate 20 corresponds to the first substrate in the case in which the supporting substrate 10 corresponds to the second substrate.

In FIG. 1, a portion of the wavelength conversion member 60 and a portion of the protective member 70 are omitted to visualize part of the wires 80 and part of the light-emitting elements 1 for convenience of illustration.

The orthogonal coordinate system is employed hereinafter in the present specification for convenience of explanation. A direction from the supporting substrate 10 to the wiring substrate 20 of the light-emitting module 100 is referred to as a "third direction Z" as shown in FIG. 1. The third direction Z is also referred to as an "upward direction." The direction opposite to the third direction Z is also referred to as a "downward direction." One direction orthogonal to the third direction Z is referred to as a "first direction X." The direction orthogonal to the third direction Z and the first direction X is referred to as a "second direction Y." For example, one plane parallel to the first direction X and the second direction Y is referred to as an "XY-plane" for convenience of explanation. For example, one plane parallel to the first direction X and the third direction Z is referred to as an "XZ-plane."

For example, the supporting substrate 10 may have the shape of a rectangular plate. The supporting substrate 10 includes a single layer or a plurality of layers of wiring containing an electroconductive material such as copper (Cu), silver (Ag), gold (Au), aluminum (Al), platinum (Pt), titanium (Ti), tungsten (W), palladium (Pd), rhodium (Rh), ruthenium (Ru), iron (Fe), nickel (Ni), and an alloy containing one of these metals in an insulating base 11 containing an insulating material such as a ceramic material and a resin material. As shown in FIG. 2, portions of the wiring are exposed on the upper surface of the supporting substrate 10 to constitute a plurality of upper surface pads 12, and other portions of the wiring are exposed on the lower surface of the supporting substrate 10 to constitute a plurality of lower surface pads 13.

As shown in FIG. 1 and FIG. 2, a heat dissipation portion 14 containing a thermally conductive material such as copper (Cu), silver (Ag), gold, (Au), aluminum (Al), platinum (Pt), titanium (Ti), tungsten (W), palladium (Pd), rhodium (Rh), ruthenium (Ru), iron (Fe), nickel (Ni), and an alloy containing one of these metals is exposed on the upper surface and the lower surface of the supporting substrate 10. The heat dissipation portion 14 is located at the center of the supporting substrate 10 in a plan view. The heat dissipation portion 14 has a substantially rectangular shape having long sides of which are substantially parallel to, for example, long sides of the supporting substrate 10. For example, the heat dissipation portion 14 has a thermal conductivity of 400 W/mk. For example, the coefficient of linear expansion of the heat dissipation portion 14 is $17 \times 10^{-6}$ K$^{-1}$.

The upper surface pads 12 and the lower surface pads 13 are located on both sides of the heat dissipation portion 14. For example, the upper surface pads 12 and the lower surface pads 13 are arranged along the long sides of the supporting substrate 10.

As shown in FIG. 1, the heat dissipation member 30 is disposed over the heat dissipation portion 14 of the supporting substrate 10. As shown in FIG. 2, the heat dissipation member 30 includes a graphite member (graphite) 31 and a metal member 32.

The graphite member 31 has a lower surface 31A (corresponding to a first surface or a second surface in the claims) facing the heat dissipation portion 14 of the supporting substrate 10 and an upper surface 31B (corresponding to the second surface or the first surface in the claims) opposite to the lower surface 31A. For example, the upper surface 31B corresponds to the second surface in the case in which the lower surface 31A corresponds to the first surface, and the upper surface 31B corresponds to the first surface in the case in which the lower surface 31A corresponds to the second surface.

As shown in FIG. 2, the metal member 32 includes a first metal layer 321 disposed on the lower surface 31A of the graphite member 31 and a second metal layer 322 disposed on the upper surface 31B. For the first metal layer 321 and the second metal layer 322, for example, a thermally conductive material such as copper (Cu), silver (Ag), gold (Au), aluminum (Al), titanium (Ti), tungsten (W), rhodium (Rh), ruthenium (Ru), iron (Fe), nickel (Ni), molybdenum (Mo), and an alloy containing one of these metals can be used, and sintered metal containing copper, silver, gold, or the like can be more preferably used.

The first metal layer 321 is in contact with the heat dissipation portion 14 of the supporting substrate 10 to bond the heat dissipation portion 14 of the supporting substrate 10 to the lower surface 31A of the graphite member 31.

The wiring substrate 20 is disposed on the second metal layer 322, and the second metal layer 322 bonds the upper surface 31B of the graphite member 31 to the lower surface of the wiring substrate 20. As described above, the upper surface 31B of the graphite member 31 faces the lower surface of the wiring substrate 20, and the wiring substrate 20 is disposed on the heat dissipation member 30.

The term "face" as used herein also encompasses that the members face each other with another member interposed therebetween. For example, the first metal layer 321 of the metal member 32 is disposed between the lower surface 31A of the graphite member 31 and the upper surface of the supporting substrate 10, and for example, the second metal layer 322 of the metal member 32 is disposed between the upper surface 31B of the graphite member 31 and the lower surface of the wiring substrate 20.

For example, as shown in FIG. 1, the wiring substrate 20 is a silicon substrate with a built-in integrated circuit such as an application specific integrated circuit board (ASIC board). Examples of the material of the wiring substrate 20 also include silicon carbide (SiC), gallium nitride (GaN), silicon nitride (SiN), aluminum nitride (AlN), gallium oxide (GaO), and diamond (C).

In order to enhance the adhesion of the wiring substrate 20 to the second metal layer 322, a plating layer is disposed on the lower surface of the wiring substrate 20. The plating layer contains, for example, titanium (Ti), silver (Ag), copper (Cu), gold (Au), aluminum (Al), platinum (Pt), tungsten (W), palladium (Pd), iron (Fe), nickel (Ni), rhodium (Rh), ruthenium (Ru), or an alloy containing at least one of these metals. The plating layer is constituted of a single layer or a plurality of layers, and in an example, titanium and silver are layered in this order from the wiring substrate 20 side. Pads to be connected to the light-emitting elements 1 are disposed on the central portion of the upper surface 20B of the wiring substrate 20, and external connecting pads are disposed around the pads.

The wiring substrate 20 has a substantially rectangular shape having, for example, long sides with a length of 14.5 mm and short sides with a length of 5.4 mm in a plan view. For example, the long sides of the wiring substrate 20 are parallel to the first direction X. For example, the thickness of the wiring substrate 20 is 0.615 mm. For example, the coefficient of linear expansion of the wiring substrate 20 is $4.7 \times 10^{31}$K$^{-1}$ or less.

A plurality of light-emitting elements 1 are disposed on the central portion of the upper surface 20B of the wiring substrate 20 as shown in FIG. 1. For example, the light-emitting elements 1 are arranged in a matrix as shown in FIG. 3. In an example, four segments each including a 64 by 64 array of light-emitting elements 1 are arranged; that is, 16,384 light-emitting elements 1 are arranged in total. In an example, the arrangement pitch of the light-emitting elements 1 is 50 μm, and the size of each light-emitting element 1 is 45 μm. Accordingly, the distance between adjacent light-emitting elements 1 is 5 μm.

A lower surface electrode of the light-emitting element 1 is connected to a pad exposed on the upper surface 20B of the wiring substrate 20. For example, the light-emitting element 1 is a light-emitting diode (LED) and emits blue light.

For example, the reflective member 50 is disposed around the light-emitting elements 1 as shown in FIG. 3 and covers lateral surfaces of the light-emitting elements 1 as shown in FIG. 2. The reflective member 50 contains a light-reflective substance mixed in a base material formed of a light-transmissive resin. Examples of the light-transmissive resin include a silicone resin, a modified silicone resin, an epoxy resin, a modified epoxy resin, an acrylic resin, and a hybrid resin containing at least one of these resins. Among these materials, a silicone resin resistant to heat and light is preferably used, and a dimethyl silicone resin is more preferably used. Examples of the light-reflective substance include titanium oxide, aluminum oxide, zinc oxide, barium carbonate, barium sulfate, boron nitride, aluminum nitride, and glass filler. The reflective member 50 may contain a light-absorbing substance such as carbon black.

As shown in FIG. 1, the wavelength conversion member 60 is disposed in a region of the upper surface of the wiring substrate 20 other than the external connecting pads and covers the upper surfaces of the light-emitting elements 1 and upper and lateral surfaces of the reflective member 50. The wavelength conversion member 60 contains a phosphor mixed in a base material formed of a light-transmissive resin and can absorb and convert at least part of light emitted from the light-emitting elements 1 into light with a wavelength different from the wavelength of the light emitted from the light-emitting elements 1. For example, the light-transmissive resin of the wavelength conversion member 60 can be appropriately selected from the examples of the light-transmissive resin for the reflective member 50.

Examples of the phosphor include yttrium-aluminum-garnet based phosphors (such as $Y_3(Al,Ga)_5O_{12}$:Ce), lutetium-aluminum-garnet based phosphors (such as $Lu_3(Al,Ga)_5O_{12}$:Ce), terbium-aluminum-garnet based phosphors (such as $Tb_3(Al,Ga)_5O_{12}$:Ce), CCA based phosphors (such as $Ca_{10}(PO_4)_6Cl_2$:Eu), SAE based phosphors (such as $Sr_4Al_{14}O_{25}$:Eu), chlorosilicate based phosphors (such as $Ca_8MgSi_4O_{16}Cl_2$:Eu), nitride based phosphors such as β-SiAlON based phosphors (such as $(Si,Al)_3(O,N)_4$:Eu), α-SiAlON based phosphors (such as $Ca(Si,Al)_{12}(O,N)_{16}$:Eu), SLA based phosphors (such as $SrLiAl_3N_4$:Eu), CASN based phosphors (such as CaAlSiN3:Eu), and SCASN based phosphors (such as $(Sr,Ca)AlSiN_3$:Eu), fluoride based phosphors such as KSF based phosphors (such as $K_2SiF_6$:Mn), KSAF based phosphors (such as $K_2Si_{0.99}Al_{0.01}F_{5.99}$:Mn), and MGF based phosphors (such as $3.5MgO \cdot 0.5MgF_2 \cdot GeO_2$:Mn), phosphors having a perovskite structure (such as $CsPb(F,Cl,Br,I)_3$), and quantum-dot phosphors (such as CdSe, InP, $AgInS_2$, and $AgInSe_2$).

The wires 80 are connected to the upper surface pads 12 of the supporting substrate 10 and the external connecting pads of the wiring substrate 20 as shown in FIG. 1 and FIG. 2. For the wires 80, for example, gold (Au), copper (Cu), platinum (Pt), aluminum (Al), or an alloy containing one of these metals can be used, and gold, which has good thermal resistance and the like, is particularly preferable.

The protective member 70 has the shape of a rectangular frame lying along the outer edges of the wiring substrate 20 as shown in FIG. 1 and FIG. 2. The protective member 70 is disposed on a portion of the supporting substrate 10 and a portion of the wiring substrate 20 and covers, for example, the upper surface pads 12 of the supporting substrate 10, the wires 80, the external connecting pads of the wiring substrate 20, the outer edges of the wavelength conversion member 60, and the lateral surfaces of the heat dissipation member 30.

The protective member 70 includes an outer frame portion 71, an inner frame portion 72, and a covering portion 73 as shown in FIG. 2. The outer frame portion 71 is disposed on the supporting substrate 10. The inner frame portion 72 is disposed on the wiring substrate 20. The covering portion 73 is disposed between the outer frame portion 71 and the inner frame portion 72 and covers the ends of the wiring substrate 20 and the lateral surfaces of the heat dissipation member 30.

For example, the outer frame portion 71, the inner frame portion 72, and the covering portion 73 are formed of a light-transmissive resin, and examples of the resin include a silicone resin, a modified silicone resin, an epoxy resin, a modified epoxy resin, an acrylic resin, and a hybrid resin containing at least one of these resins. Among these materials, a silicone resin resistant to heat and light is preferably used, and a dimethyl silicone resin is more preferably used. For example, the covering portion 73 contains a filler mixed in a base material formed of a light-transmissive resin. For the filler, a member similar to the light-reflective substance or the light-absorbing substance contained in the reflective member 50 described above can be used. More specifically, by appropriately selecting the filler to be contained in the light-transmissive resin for the covering portion 73, a white resin having good light reflective properties, a black resin having good light absorptive properties, a gray resin having light reflective properties and light absorptive properties, or the like, can be used according to the intended use.

The heat dissipation member 30 will be further described below.

The heat dissipation member 30 further includes plating layers 40 to improve the adhesion to the metal member 32. The plating layers 40 are disposed on the surfaces of the graphite member 31. For the plating layers 40, for example, copper (Cu), silver (Ag), gold (Au), aluminum (Al), titanium (Ti), tungsten (W), rhodium (Rh), ruthenium (Ru), iron (Fe), nickel (Ni), molybdenum (Mo), or an alloy containing one of these metals can be used, and gold, which has good thermal resistance and the like, is particularly preferable.

The graphite member 31 is constituted of a plurality of sheets of graphene, which is a monolayer of carbon atoms, layered on top of each other. In the graphite member 31, a plurality of sheets of graphene are lied in a parallel direction to the XZ-plane and layered in the second direction Y as shown in FIG. 4. The graphite member 31 has at least one gap 31s between two graphene sheets adjacent to each other in the second direction Y. There are a plurality of gaps 31s as shown in FIG. 4 to FIG. 6. Each gap 31s extends substantially along the XZ-plane in a planar fashion. The gap 31s extends in the first direction X in the XY-plane as shown in FIG. 4. For example, the sheets of graphene layered on top of each other are partially distorted, and the gaps 31s have various shapes.

As for the gaps 31s, portions that are open to the lower surface 31A of the graphite member 31 are referred to as first grooves 311, and portions that are open to the upper surface 31B are referred to as second grooves 312 as shown in FIG. 4 and FIG. 5. That is, the gaps 31s constitute the first grooves 311 in the lower surface 31A in the case in which the gaps 31s reach the lower surface 31A of the graphite member 31 and constitute the second grooves 312 in the upper surface 31B in the case in which the gaps 31s reach the upper surface 31B. A single gap 31s may reach both the lower surface 31A and the upper surface 31B as described below. In this case, the first groove 311 and the second groove 312 communicate with each other.

The "width" of each first groove 311 refers to the length of the first groove 311 on the lower surface 31A in the Y direction, the "length" refers to the length on the lower surface 31A in the X direction, and the "depth" refers to the length from the lower surface 31A in the Z direction. Likewise, the "width" of each second groove 312 refers to the length of the second groove 312 on the upper surface 31B in the Y direction, the "length" refers to the length on the upper surface 31B in the X direction, and the "depth" refers to the length from the upper surface 31B in the Z direction.

As described above, the graphite member 31 has a plurality of first grooves 311 and a plurality of second grooves 312. The first grooves 311 and the second grooves 312 are each constituted of two graphene sheets adjacent to each other in the second direction Y. The first grooves 311 and the second grooves 312 extend in the X direction.

For example, the shapes of the first grooves 311 and the second grooves 312 differ from each other in the widths at several positions in the upper-lower direction (Z direction) and vary in the depth. Specific examples are described below.

As shown in FIG. 5, gaps 31s respectively including first grooves 311a, 311b, 311c, 311d, and 311e extend through the graphite member 31 and are open also to the upper surface 31B. Accordingly, second grooves 312a, 312b, 312c, 312d, and 312e are located above the respective first grooves 311a, 311b, 311c, 311d, and 311e, and the first grooves 311a, 311b, 311c, 311d, and 311e respectively communicate with the corresponding second grooves 312a, 312b, 312c, 312d, and 312e. The second grooves 312a, 312b, 312c, 312d, and 312e include portions overlapping with the corresponding first grooves 311a, 311b, 311c, 311d, and 311e in a plan view.

As shown in FIG. 5, the width of the first groove 311a on the lower surface 31A is greater than the width of the second groove 312a on the upper surface 31B. The width of the first groove 311b on the lower surface 31A is smaller than the width of the second groove 312b on the upper surface 31B.

As for the first groove 311c, the width is greater in the intermediate portion of the thickness of the graphite member 31 than at the opening. The width of the first groove 311d is substantially uniform in the depth direction.

As for the first groove 311e, the width is smaller in the intermediate portion of the graphite member 31 than at the lower surface 31A.

As for the second groove 312e, the width is smaller in the intermediate portion of the graphite member 31 than at the upper surface 31B.

A first groove 311f has a small width in the intermediate portion of the thickness of the graphite member 31, does not extend through the graphite member 31, and does not overlap with the second grooves 312 in a plan view.

A second groove 312f has a small width in the lower portion of the graphite member 31, does not extend through the graphite member 31, and does not overlap with the first grooves 311 in a plan view.

Each of the maximum width of the first groove 311 on the lower surface 31A and the maximum width of the second groove 312 on the upper surface 31B is, for example, 1 μm or more and 100 μm or less, more preferably 10 μm or more and 50 μm or less.

On the lower surface 31A of the graphite member 31, the first grooves 311 preferably occupy a large area and have large lengths and widths of the openings.

On the upper surface 31B of the graphite member 31, the second grooves 312 preferably occupy a large area and have large lengths and widths of the openings.

The graphite member 31 is anisotropic in terms of thermal conductivity and coefficient of linear expansion because of the multilayer structure of graphene. A direction parallel to the XZ-plane of the graphite member 31 is an in-plane direction of graphene, so that a high thermal conductivity and a small coefficient of linear expansion are exhibited in this direction. The second direction Y of the graphite member 31 is the layering direction of graphene, so that a low thermal conductivity and a large coefficient of linear expansion are exhibited in this direction.

Specifically, for example, the thermal conductivities of the graphite member 31 are 1700 W/mk in the first direction X and the third direction Z and 7 W/mk in the second direction Y. For example, the thermal conductivities of the graphite member 31 in the first direction X and the third direction Z are about 4.3 times as large as the thermal conductivity of copper and about 8.5 times as large as the thermal conductivity of aluminum. The fact that the thermal conductivity of the graphite member 31 in the second direction Y is lower than the thermal conductivities in the first direction X and the third direction Z may be attributable to, for example, the multilayer structure of graphene and clearances in the gaps 31s.

For example, the coefficient of linear expansion of the graphite member 31 is $0.5 \times 10^{-6}$ K$^{-1}$ in the third direction Z and the first direction X and $25 \times 10^{-6}$ K$^{-1}$ in the second direction Y. For example, the modulus of elasticity of the graphite member 31 is smaller than 50 GPa and for example, 42% or less of the modulus of elasticity of copper.

As described above, the graphite member 31 has good heat dissipation performance and a low modulus of elasticity in a certain direction and exhibits high thermal shock resistance.

The thickness, or the length in the Z direction, of the graphite member 31 is, for example, 500 μm.

As shown in FIG. 5 and FIG. 6, a first plating layer 41 is disposed between the graphite member 31 and the first metal layer 321. The first plating layer 41 is in contact with the lower surface 31A of the graphite member 31 except for the openings of the first grooves 311. Specifically, the first plating layer 41 covers the edges of the openings of the first grooves 311 and does not close the openings of the first grooves 311.

As shown in FIG. 5, a second plating layer 42 is disposed between the graphite member 31 and the second metal layer 322. The second plating layer 42 is in contact with the upper surface 31B of the graphite member 31 except for the openings of the second grooves 312. Specifically, the second plating layer 42 covers the edges of the openings of the second grooves 312 and does not close the openings of the second grooves 312.

For example, the first plating layer 41 and the second plating layer 42 contain gold. The first plating layer 41 has a thickness smaller than that of the first metal layer 321, and the second plating layer 42 has a thickness smaller than that of the second metal layer 322.

The metal member 32 includes first internal metal members 321i and second internal metal members 322i in addition to the first metal layer 321 and the second metal layer 322.

As shown in FIG. 5, the first internal metal members 321i are disposed in the first grooves 311. The lower ends of the first internal metal members 321i are in contact with the first metal layer 321 and in contact with the edges of the first plating layer 41 at the openings of the first grooves 311. The first internal metal members 321i are each disposed between two sheets of graphene constituting a first groove 311 and, for example, are each in contact with the two sheets of graphene.

The second internal metal members 322i are disposed in the second grooves 312 and have upper ends in contact with the second metal layer 322. The upper ends of the second internal metal members 322i are also in contact with the edges of the second plating layer 42 at the openings of the second grooves 312. The second internal metal members 322i are each disposed between two sheets of graphene constituting a second groove 312 and, for example, are each in contact with the two sheets of graphene.

As shown in FIG. 5, a first internal metal member 321ia disposed in the first groove 311a is disposed below a second internal metal member 322ia disposed in the second groove 312a and is spaced apart from the second internal metal member 322ia. For example, a clearance Al is located between the upper end of the first internal metal member 321ia and the lower end of the second internal metal member 322ia. The first internal metal member 321ia has substantially the same width at the lower end and the upper end. The second internal metal member 322ia has substantially the same width at the lower end and the upper end.

The upper portion of a first internal metal member 321ic disposed in the first groove 311c is in contact with the lower portion of a second internal metal member 322ic, and the width of this portion where the first internal metal member 321ic and the second internal metal member 322ic are in contact is greater than the width of the lower end of the first internal metal member 321ic and greater than the width of the upper end of the second internal metal member 322ic. For example, the clearance Al is not located between the upper portion of the first internal metal member 321ic and the lower portion of the second internal metal member 322ic.

As for a first internal metal member 321if disposed in the first groove 311f, the upper end is located in the intermediate portion of the thickness of the graphite member 31, and for example, the first groove 311f narrows down above the upper end. The first internal metal member 321if does not overlap with the second internal metal members 322i.

As for a second internal metal member 322if disposed in the second groove 312f, the lower end is located in the intermediate portion of the thickness of the graphite member 31, and for example, the second groove 312f narrows down below the lower end. The second internal metal member 322if does not overlap with the first internal metal members 321i.

It is preferable that the metal member 32 include many first internal metal members 321i, that the first internal metal members 321i occupy a large area on the lower surface 31A of the graphite member 31, and that the widths of the first internal metal members 321i be great. It is preferable that the metal member 32 include many second internal metal members 322i, that the second internal metal members 322i occupy a large area on the upper surface 31B of the graphite member 31, and that the widths of the second internal metal members 322i be large.

The metal member 32 is formed of sintered metal containing silver (Ag) in the present example. Silver before sintering has a particle diameter sufficiently smaller than the widths of the first grooves 311 and the second grooves 312 and small enough to allow the particles to enter the first grooves 311 and the second grooves 312, and the particle diameter is, for example, 0.1 μm or more and 0.9 μm or less. The thermal conductivity of the metal member 32 is high, such as higher than the thermal conductivity of the wiring substrate 20. The metal member 32 exhibits low thermal shock resistance because of a high modulus of elasticity.

The light-emitting module 100 with the structure described above is used for, for example, a light source for a vehicle headlight. In this case, for example, a lens is disposed above the light-emitting module 100, and light is emitted from the light source to the outside through the lens. For example, the light-emitting module 100 has a length of short sides of 10 mm and a length of long sides of 16 mm in a plan view.

Manufacturing Method

FIG. 7A to FIG. 9 schematically show a method of manufacturing the light-emitting module according to the embodiment.

The supporting substrate 10 is provided.

As shown in FIG. 1 and FIG. 2, a member in which the upper surface pads 12 and the heat dissipation portion 14 having predetermined shapes are formed in the insulating base 11 is provided as the supporting substrate 10.

Subsequently, the graphite member 31 is provided.

Figure 7A:
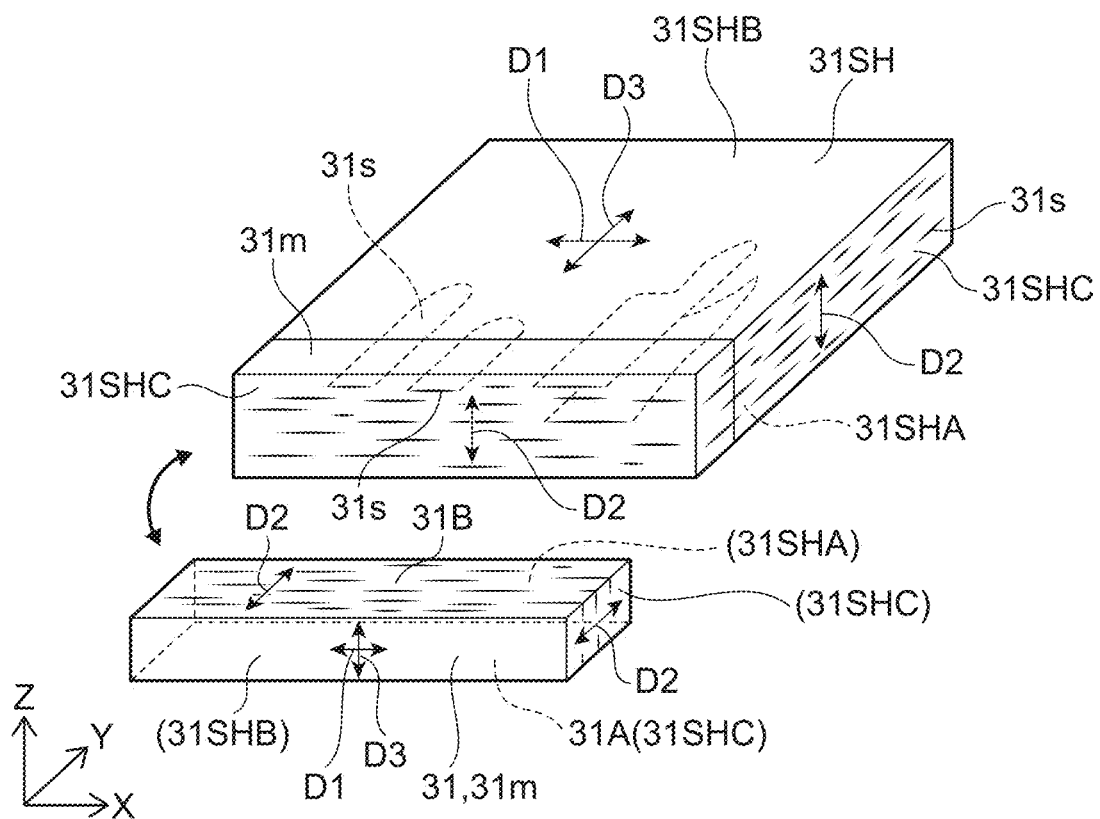
FIG. 7A schematically shows a method of manufacturing the light-emitting module according to the embodiment.

For example, the graphite member 31 may be formed by cutting a graphite member sheet 31SH as shown in FIG. 7A. For example, the graphite member sheet 31SH is formed by chemical vapor deposition (CVD) using a hydrocarbon gas such as ethylene (CH). The graphite member sheet 31SH formed by CVD shows good uniformity of crystals and an impurity content of 1 ppm or less.

In the graphite member sheet 31SH, for example, a plurality of graphene sheets lying along a lower surface 31SHA of the graphite member sheet 31SH are layered from the lower surface 31 SHA to an upper surface 31SHB as shown in FIG. 7A. The graphite member sheet 31SH has a plurality of gaps 31s extending along the lower surface 31 SHA.

For example, the graphite member sheet 31SH has the shape of a vertically long plate in a plan view as shown in FIG. 7A. In the graphite member sheet 31 SH, the lower surface 31SHA and the upper surface 31 SHB are constituted of surfaces of graphene, and lateral surfaces 31SHC are constituted of edges of layered graphene sheets. The lateral surfaces 31SHC have openings of the gaps 31s. For example, as for the graphite member sheet 31SH, a lateral side of the upper surface 31 SHB corresponds to a long side of the graphite member 31, and the thickness corresponds to a short side of the graphite member 31.

As shown in FIG. 7A, in the graphite member sheet 31SH, a direction D1 and a direction D3, which are in-plane directions of graphene, are parallel to the lower surface 31 SHA, and a direction D2, which is the layering direction of graphene, is orthogonal to the lower surface 31SHA.

The graphite member sheet 31SH has the thermal conductivities in the direction D1 and the direction D3 higher than the thermal conductivity in the direction D2, and the coefficients of linear expansion in the direction D1 and the direction D3 lower than the coefficient of linear expansion in the direction D2.

Subsequently, the graphite member sheet 31 SH is cut to form the graphite member 31.

For example, the graphite member sheet 31SH is cut parallel to the lateral side on the upper surface to have a width of 500 μm to form a graphite member piece 31m as shown in FIG. 7A.

In the graphite member piece 31m, similarly to the graphite member sheet 31SH, a plurality of graphene sheets lying along the lower surface are layered from the lower surface to the upper surface, and the openings of the gaps 31s extending along the lower surface are formed in the lateral surfaces and the broken-out section. Also in the graphite member piece 31m, the direction D1 and the direction D3, which are in-plane directions of graphene, are parallel to the lower surface, and the direction D2, which is the layering direction of graphene, is orthogonal to the lower surface.

For example, the graphite member piece 31m is rotated 90° about a lateral side of the lower surface as shown in FIG. 7A is used as the graphite member 31. Accordingly, the graphene sheets and the gaps 31s in the graphite member 31 are orthogonal to the lower surface 31A and parallel to the XZ-plane parallel to the long sides of the lower surface 31A.

As described above, in the graphite member 31, the direction D1 and the direction D3, which are the in-plane directions of graphene, correspond to the first direction X and the third direction Z, and the direction D2, which is the layering direction of graphene, corresponds to the second direction Y. Accordingly, the graphite member 31 has the thermal conductivities in the first direction X and the third direction Z higher than the thermal conductivity in the second direction Y, and the coefficients of linear expansion in the first direction X and the third direction Z lower than the coefficient of linear expansion in the second direction Y.

Subsequently, for example, the plating layers 40 are formed by flash plating on the lower surface 31A and the upper surface 31B of the graphite member 31. The first plating layer 41 and the second plating layer 42 are thus formed.

Figure 7B:
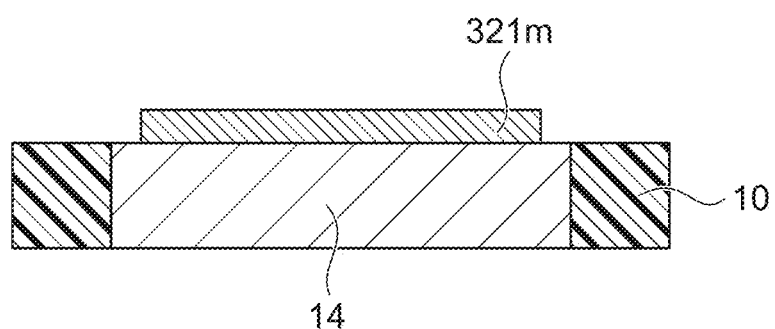
FIG. 7B schematically shows the method of manufacturing the light-emitting module according to the embodiment.

Subsequently, a sintering material 321m is applied to the heat dissipation portion 14 of the supporting substrate 10 as shown in FIG. 7B. For example, the sintering material 321m contains silver particles and a solvent, and the amount of the silver particles is appropriately adjusted according to the particle diameter of the silver particles such that the silver particles sufficiently enter the first grooves 311.

Figure 8A:
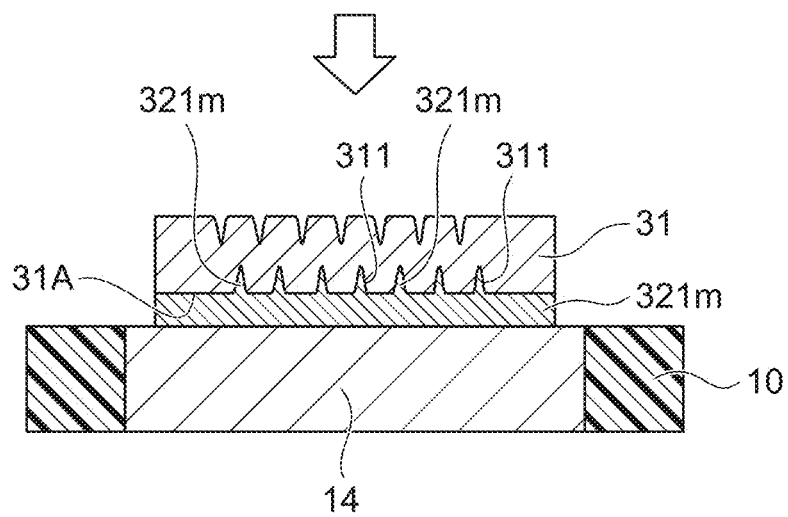
FIG. 8A schematically shows the method of manufacturing the light-emitting module according to the embodiment.

The graphite member 31 is placed on the sintering material 321m as shown in FIG. 8A.

When the lower surface 31A of the graphite member 31 is placed on the sintering material 321m, a pressure is preferably applied to the graphite member 31 downward as appropriate. At this time, the sintering material 321m adheres to the upper surface of the heat dissipation portion 14 and the lower surface 31A of the graphite member 31 and partially enters the first grooves 311 of the graphite member 31 due to the wettability and the downward pressure from the graphite member 31.

Subsequently, the wiring substrate 20 and the light-emitting elements 1 are provided, and the light-emitting elements 1 are mounted on the wiring substrate 20. For example, the light-emitting elements 1 are connected to the pads of the wiring substrate 20 with a bonding material containing copper (Cu), gold (Au), or silver (Ag) therebetween. The wiring substrate 20 on which the light-emitting elements 1 have been mounted may be provided by purchasing or the like from the outside.

Subsequently, the reflective member 50 is formed on the lateral surfaces of the light-emitting elements 1 as shown in FIG. 3.

The reflective member 50 contains a light-reflective substance mixed in a base material formed of a light-transmissive resin. For example, the reflective member 50 is disposed over a region including upper surfaces of a plurality of light-emitting elements 1 to cover the upper surfaces and the lateral surfaces of the light-emitting elements 1, and a portion in contact with the upper surfaces of the light-emitting elements 1 is removed.

Figure 8B:
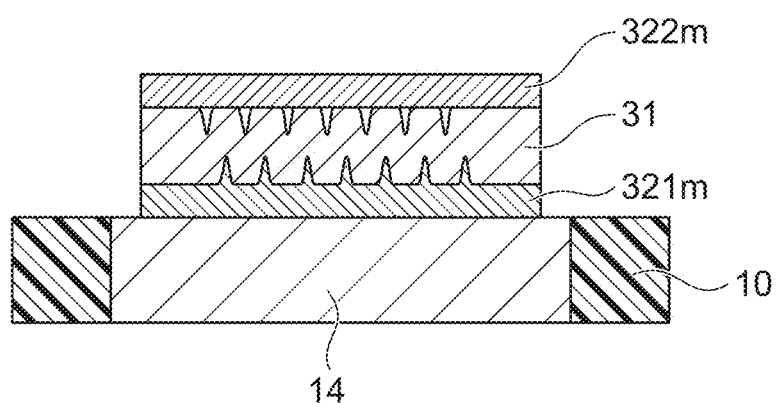
FIG. 8B schematically shows the method of manufacturing the light-emitting module according to the embodiment.

Subsequently, a sintering material 322m is applied to the graphite member 31 as shown in FIG. 8B. For example, the sintering material 322m is the same as the sintering material 321m.

Figure 9:
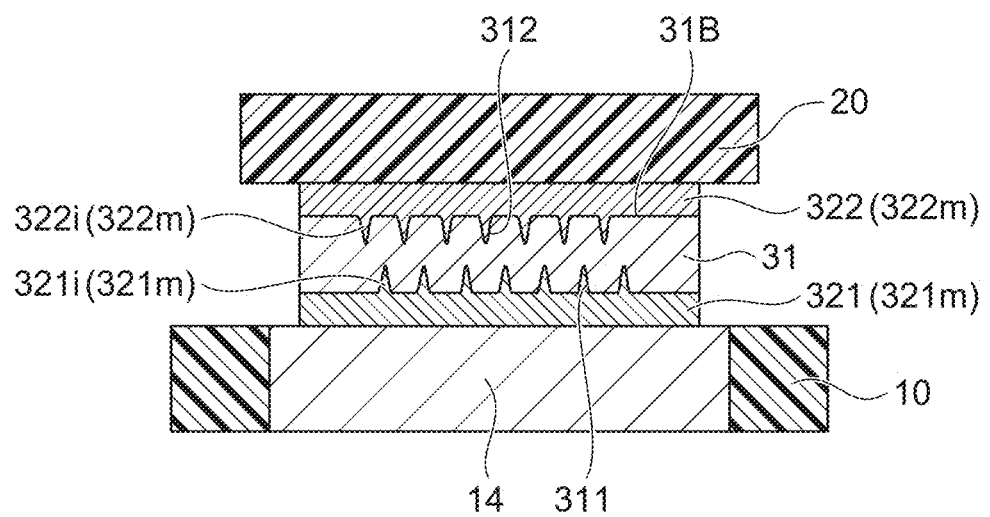
FIG. 9 schematically shows the method of manufacturing the light-emitting module according to the embodiment.

Subsequently, the wiring substrate 20 is placed on the sintering material 322m as shown in FIG. 9. When the lower surface of the wiring substrate 20 is placed on the sintering material 322m, a pressure is preferably applied to the wiring substrate 20 downward as appropriate. At this time, the sintering material 322m adheres to the upper surface 31B of the graphite member 31 and the lower surface of the wiring substrate 20 and partially enters the second grooves 312 of the graphite member 31 due to the wettability and the downward pressure from the wiring substrate 20.

Subsequently, the supporting substrate 10 and the wiring substrate 20 are bonded to the graphite member 31. Bonding to the graphite member 31 is performed by sintering the sintering materials 321m and 322m. Specifically, heating is preferably performed while applying a downward pressure.

At this time, part of the sintering material 321m further enters the first grooves 311 due to the wettability and the downward pressure and is sintered. Likewise, part of the sintering material 322m further enters the second grooves 312 and is sintered. Through sintering, the sintering material 321m becomes the first metal layer 321 and the first internal metal members 321i of the metal member 32, and the sintering material 322m becomes the second metal layer 322 and the second internal metal members 322i.

Subsequently, the upper surface pads 12 of the supporting substrate 10 are connected to the external connecting pads of the wiring substrate 20 by the wires 80 as shown in FIG. 2.

Subsequently, the wavelength conversion member 60 is formed.

The wavelength conversion member 60 is formed in a region including upper surfaces of a plurality of light-emitting elements 1 as shown in FIG. 3. The wavelength conversion member 60 that has been processed into a sheet with a predetermined size is disposed over a plurality of light-emitting elements 1 as shown in FIG. 1. The wavelength conversion member 60 may be secured to the light-emitting elements 1 with a light-transmissive bonding member such as resin therebetween or may be secured using tackiness or the like of the wavelength conversion member without the bonding member.

Subsequently, the outer frame portion 71 is formed on the supporting substrate 10, and the inner frame portion 72 is formed on the wiring substrate 20. The covering portion 73 is formed between the outer frame portion 71 and the inner frame portion 72. The protective member 70 that covers the lateral surfaces of the heat dissipation member 30 and protects the wires 80 is thus formed.

The light-emitting module 100 is manufactured as described above.

The order of the steps in the manufacture of the light-emitting module 100 is not limited to the example described above. That is, the example above has been described in the order of (1) providing the supporting substrate 10, (2) providing the graphite member 31, (3) providing the wiring substrate 20 (including the light-emitting elements 1 and the reflective member 50), (4) disposing the wiring substrate 20 on the supporting substrate 10 with the graphite member 31 and the like therebetween, (5) connecting the wires 80, (6) disposing the wavelength conversion member 60, and (7) disposing the protective member 70, but this order is not limiting. For example, the steps of (1) providing the supporting substrate 10, (2) providing the graphite member 31, and (3) providing the wiring substrate 20 (including the light-emitting elements 1 and the reflective member 50) described above are in random order. The order of the steps of (5) connecting the wires 80 and (6) disposing the wavelength conversion member 60 may be reversed. That is, the wires 80 may be connected after the wavelength conversion member 60 is disposed.

Operation

In the light-emitting module 100, when the light-emitting elements 1 are turned on, heat is generated in the light-emitting elements 1 and transferred to the wiring substrate 20 through the pads. In this case, the wiring substrate 20 has a low thermal conductivity as a whole and the heat from the pads is unlikely to be transferred in all the first direction X, the second direction Y, the third direction Z, and the like, and differences in temperature may be easily caused in the wiring substrate 20 in a plan view. However, the thermal conductivities of the second metal layer 322 and the second plating layer 42 are higher than the thermal conductivity of the wiring substrate 20, so that the heat transferred from the lower surface of a high-temperature portion of the wiring substrate 20 to the second metal layer 322 and the second plating layer 42 is broadly transferred in all directions through the second metal layer 322 and the second plating layer 42. The light-emitting module 100 exhibits good heat dissipation of the wiring substrate 20 and reduced unevenness in heat in the wiring substrate 20.

The heat that has spread over the second metal layer 322 and the second plating layer 42 is transferred from the entirety of the lower surface of the second plating layer 42 to substantially the entirety of the upper surface 31B of the graphite member 31. The heat that has been received by substantially the entirety of the upper surface 31B is not apt to be transferred in the second direction Y but is apt to be transferred in the third direction Z and the first direction X in the graphite member 31. As described above, the direction from the wiring substrate 20 to the supporting substrate 10 corresponds to the direction in which the thermal conductivity of the graphite member 31 is high, and thus the heat is apt to be transferred in this direction. With the second metal layer 322 having high thermal conductivities in all directions disposed on the graphite member 31 having a low thermal conductivity in the second direction Y, heat has been broadly transferred to the upper surface 31B of the graphite member 31, so that the heat is rapidly transferred downward from the upper surface 31B in the graphite member 31.

In the region directly below the high-temperature portion of the wiring substrate 20, heat is rapidly transferred through the second metal layer 322 and the second plating layer 42 in the thickness direction, in which the distances are shortest, and the heat is rapidly transferred downward from the upper surface 31B of the graphite member 31 located directly below the high-temperature part. In the region directly below the high-temperature portion of the wiring substrate 20, heat is more rapidly dissipated, and differences in temperature are small in the wiring substrate 20.

The heat transferred from the lower surface 31A of the graphite member 31 is transferred at substantially the same speed in all directions through the first plating layer 41 and the first metal layer 321 and transferred from the lower surface of the first metal layer 321 to the upper surface of the heat dissipation portion 14 of the supporting substrate 10.

As described above, the heat dissipation member 30 has low thermal resistance in all directions and reduces temperature differences in the wiring substrate 20, so that temperature differences in the wiring substrate 20 are reduced even in the case in which, for example, part of a plurality of light-emitting elements 1 locally arranged are turned on, which facilitates temperature control of the wiring substrate 20.

In a portion of the graphite member 31 in which a plurality of layered graphene sheets adhere to each other, heat is more rapidly transferred in the first direction X and the third direction Z than in the second direction Y, and in the first grooves 311 and the second grooves 312, heat is rapidly transferred equally in all directions in the first internal metal members 321i and the second internal metal members 322i. The first internal metal members 321i and the second internal metal members 322i having thermal conductivities higher than the thermal conductivity of the clearances are disposed in the first grooves 311 and the second grooves 312, so that heat is rapidly transferred also in the first grooves 311 and the second grooves 312 and more rapidly dissipated than in the case of the graphite member 31 alone.

The first internal metal members 321i and the second internal metal members 322i in contact with graphene constituting inner lateral surfaces of the first grooves 311 and the second grooves 312 in the second direction Y enhance the thermal conductivity of the graphite member 31 in the second direction Y and improve heat dissipation of the wiring substrate 20. In particular, the second internal metal members 322i are located close to the wiring substrate 20 having a high temperature and directly receive heat from the second metal layer 322 that is in contact without interfaces so as to enhance the thermal conductivity of the graphite member 31 in the second direction Y and improve heat dissipation of the wiring substrate 20.

Accordingly, it is preferable that the metal member 32 include many second internal metal members 322i, that the second internal metal members 322i occupy a large area in a plan view, and that the widths of the second internal metal members 322i be great. On the upper surface 31B of the graphite member 31, it is preferable that many second grooves 312 be arranged and that the second grooves 312 occupy a large area and have large lengths and widths.

In the light-emitting module 100, the graphite member 31 having high thermal shock resistance is disposed between and bonds the supporting substrate 10 and the wiring substrate 20 that differ greatly in linear expansion to reduce the thermal stress in the supporting substrate 10, the heat dissipation member 30, and the wiring substrate 20, which improves the thermal shock resistance of the light-emitting module 100.

Further, as for the wiring substrate 20 and the graphite member 31 that are rectangular in a plan view, the long sides of the graphite member 31 set in the first direction X parallel to the plane of graphene are arranged in parallel to the long sides of the wiring substrate 20, the short sides set in the second direction Y, which is the layering direction of graphene, is arranged orthogonally to the long sides of the wiring substrate 20, and the graphite member 31 are disposed between the supporting substrate 10 and the wiring substrate 20. Accordingly, thermal expansion of the graphite member 31 having a high coefficient of linear expansion in the layering direction of graphene is reduced, and the graphite member 31 having a low coefficient of linear expansion in the first direction X further reduces the thermal stress in the wiring substrate 20 and the supporting substrate 10 in the long side direction in which the difference in thermal expansion is apt to be large.

The second metal layer 322 in contact with the second internal metal members 322i disposed in the graphite member 31 without interfaces is hardly separated from the second internal metal members 322i even when thermal stress is applied, so that the bonding strength between the wiring substrate 20 and the graphite member 31 is enhanced. Similarly, the first internal metal members 321i in contact with the first metal layer 321 without interfaces enhances the bonding strength between the wiring substrate 20 and the heat dissipation portion 14, but the heat dissipation portion 14 exhibits a large difference in linear expansion, so that the first internal metal members 321i contribute particularly to enhancement of the bonding strength.

Accordingly, it is preferable that the metal member 32 include many first internal metal members 321i, that the first internal metal members 321i occupy a large area in a plan view, and that the widths of the first internal metal members 321i be great. On the lower surface 31A of the graphite member 31, it is preferable that many first grooves 311 be arranged and that the first grooves 311 occupy a large area and have large lengths and widths.

The first internal metal members 321i and the second internal metal members 322i are respectively in contact with graphene sheets constituting the first grooves 311 and the second grooves 312 and therefore reinforce fragile graphene.

The silver particles contained in the first metal layer 321 and the second metal layer 322 are apt to be bonded to gold in the plating layers 40 and therefore improve the bonding strength. The plating layers 40 are in contact with the lower surface 31A and the upper surface 31B of the graphite member 31 to reinforce the lower surface 31A and the upper surface 31B of the fragile graphite member 31.

Effects

In the light-emitting module 100 according to the present embodiment, the heat dissipation member 30 including the graphite member 31 and the metal member 32 is disposed between the wiring substrate 20 provided with a plurality of light-emitting elements 1 and the supporting substrate 10, and the direction along the plane of graphene in which the thermal conductivity is high corresponds to the heat dissipation direction from the wiring substrate 20 to the supporting substrate 10. With this structure, the heat dissipation member 30 rapidly dissipates heat generated by the light-emitting elements 1 to the supporting substrate 10. The heat dissipation member 30 that has high thermal shock resistance reduces the thermal stress in the supporting substrate 10 and the wiring substrate 20 that differ greatly in linear expansion, to thereby improve the bonding strength. The light-emitting module 100 exhibits good heat dissipation performance and good thermal shock resistance, which allows for improving reliability.

In the case in which the light-emitting module according to the present embodiment is used for, for example, a vehicle lamp such as a vehicle headlight, the heat dissipation performance and the thermal shock resistance of the vehicle lamp can be increased, and the reliability of the vehicle lamp can be improved.

The heat dissipation member according to the present embodiment can be used not only for the light-emitting module but also various products that generate heat. In such a case also, the heat dissipation performance and the thermal shock resistance can be increased, resulting in improvement of reliability.

In the case in which only the metal member 32 is disposed between the supporting substrate 10 and the wiring substrate 20 without the graphite member 31, the metal member 32, which has high thermal conductivity and is formed of a sintered bonding agent with low thermal shock resistance, may be partially broken.

In the case in which a low-elasticity paste adhesive containing silicon, silver, and resin is used between the supporting substrate 10 and the wiring substrate 20, breakage is unlikely to be caused, but heat dissipation may not be sufficient because the thermal conductivity of the adhesive is low. Such an adhesive contains silver particles that have large particle diameters such as 1 to 2 μm and are not apt to enter the first grooves 311, and the resin is apt to flow into the first grooves 311 of the graphite member 31, so that the silver particles are not apt to enter the first grooves 311.

On the other hand, in the light-emitting module according to the present embodiment, the graphite member 31 disposed between the supporting substrate 10 and the wiring substrate 20 is bonded using the metal member 32, and high heat dissipation performance and bonding strength can be obtained.

The upper ends of the first internal metal members 321i and the lower ends of the second internal metal members 322i are located substantially in the intermediate portion of the thickness of the graphite member 31 in the present embodiment, but this structure is not limiting. For example, the upper ends of the first internal metal members 321i may extend to the vicinity of the upper surface 31B and have contact with the second plating layer 42, and the lower ends of the second internal metal members 322i may extend to the vicinity of the lower surface 31A and have contact with the first plating layer 41, depending on the thickness of the graphite member 31, the widths of the first grooves 311 and the second grooves 312, the pressurizing conditions, and the compositions of the sintering materials.

The heat dissipation member 30 in the present embodiment may be used for heat dissipation members of various products as a graphite member in which the metal member 32 has been disposed in at least one of the first grooves 311 and the second grooves 312. In this case, heat from an object can be dissipated by bringing the heat dissipation member 30 according to the present embodiment into contact with the object from which heat is to be dissipated. The thermal shock resistance can be increased by bonding the heat dissipation member 30 to the object with the first metal layer 321 or the second metal layer 322 included in the metal member 32 therebetween.

The metal member 32 and the plating layers 40 may also be disposed on the lateral surfaces of the graphite member 31. In this case, the metal member 32 and the plating layers 40 disposed on the lateral surfaces of the graphite member 31 can reduce chipping and dust generation of the lateral surfaces of the graphite member 31 and enhance the thermal conductivity in the second direction Y in the lateral surfaces parallel to the second direction Y and the third direction Z of the graphite member 31.

In addition, the metal member 32 is formed of sintered metal containing silver but is not limited thereto, and the sintered metal may contain at least one of gold, silver, and copper. In this case, silver particles, gold particles, and copper particles contained in the metal member 32 have particle diameters of, for example, 0.1 μm or more and 0.9 μm or less.

The embodiment described above is an example embodying the present invention, and the present invention is not limited to this embodiment. For example, the present invention encompasses an example in which some components are added to, removed from, or changed in the embodiment described above.

For example, embodiments of the present invention can be used for a light source for a vehicle headlight or a display.

The invention claimed is:

1. A light-emitting module comprising:
    a first substrate;
    a heat dissipation member disposed on the first substrate and comprising:
        a graphite member having a first surface facing the first substrate and a second surface located opposite to the first surface; and
        a metal member;
    a second substrate disposed on the heat dissipation member; and
    a light-emitting element disposed on a lower surface of the first substrate or an upper surface of the second substrate; wherein:
    the graphite member has a first groove extending in a first direction in the first surface;
    the metal member comprises:
        a first metal layer disposed on the first surface, and
        a first internal metal member that extends from the first metal layer and is located in the first groove; and
    the light-emitting module further comprises a first plating layer disposed between the graphite member and the first metal layer.

2. The light-emitting module according to claim 1, wherein a thickness of the first plating layer is less than a thickness of the first metal layer.

3. The light-emitting module according to claim 1, wherein:
    the graphite member has a second groove in the second surface, the second groove extending in the first direction; and
    the metal member further comprises a second internal metal member in the second groove.

4. The light-emitting module according to claim 3, wherein the metal member further comprises a second metal layer disposed on the second surface, wherein the second internal metal member extends from the second metal layer.

5. The light-emitting module according to claim 4, further comprising a second plating layer disposed between the graphite member and the second metal layer.

6. The light-emitting module according to claim 3, wherein:
    the light-emitting element is disposed on the second substrate; and
    in a second direction orthogonal to the first direction, a length of the first groove on the first surface is greater than a length of the second groove in the second direction on the second surface.

7. The light-emitting module according to claim 3, wherein:
    the light-emitting element is disposed on the second substrate; and
    in a second direction orthogonal to the first direction, a length of the first groove on the first surface is less than a length of the second groove in the second direction on the second surface.

8. The light-emitting module according to claim 3, wherein the second groove includes a portion overlapping with the first groove in a plan view and communicates with the first groove.

9. The light-emitting module according to claim 8, wherein the second internal metal member is in contact with the first internal metal member.

10. A light-emitting module comprising:
    a first substrate;
    a heat dissipation member disposed on the first substrate and comprising:
        a graphite member having a first surface facing the first substrate and a second surface located opposite to the first surface; and
        a metal member;
    a second substrate disposed on the heat dissipation member; and
    a light-emitting element disposed on a lower surface of the first substrate or an upper surface of the second substrate; wherein:
    the graphite member has a first groove extending in a first direction in the first surface, and a second groove extending in the first direction in the second surface;
    the metal member comprises:
        a metal layer disposed on the second surface
        a first internal metal member in the first groove, and
        a second internal metal member that extends from the metal layer and is located in the second groove.

11. The light-emitting module according to claim 10, wherein the second substrate has a substantially rectangular shape in a plan view and has a long side substantially parallel to the first direction.

12. The light-emitting module according to claim 10, wherein in a direction orthogonal to the first direction, a maximum length of the first groove on the first surface is 1 μm or more and 100 μm or less.

13. The light-emitting module according to claim 10, wherein in a direction orthogonal to the first direction, a maximum length of the first groove on the first surface is 10 μm or more and 50 μm or less.

14. The light-emitting module according to claim 10, wherein the metal member comprises sintered metal containing one or more elements selected from the group consisting of silver, gold, and copper.

15. A vehicle lamp comprising the light-emitting module according to claim 10.

16. The light-emitting module according to claim 10, wherein:
    the light-emitting element is disposed on the second substrate; and
    in a second direction orthogonal to the first direction, a length of the first groove on the first surface is greater than a length of the second groove in the second direction on the second surface.

17. The light-emitting module according to claim 10, wherein:
    the light-emitting element is disposed on the second substrate; and
    in a second direction orthogonal to the first direction, a length of the first groove on the first surface is less than a length of the second groove in the second direction on the second surface.

18. The light-emitting module according to claim 10, wherein a thickness of the first plating layer is less than a thickness of the first metal layer.

19. The light-emitting module according to claim 10, wherein the second groove includes a portion overlapping with the first groove in a plan view and communicates with the first groove.

20. A light-emitting module comprising:
- a first substrate;
- a heat dissipation member disposed on the first substrate and comprising:
  - a graphite member having a first surface facing the first substrate and a second surface located opposite to the first surface; and
  - a metal member;
- a second substrate disposed on the heat dissipation member; and
- a light-emitting element disposed on a lower surface of the first substrate or an upper surface of the second substrate; wherein:
- the graphite member has a first groove extending in a first direction in the first surface, and a second groove extending in the first direction in the second surface;
- the metal member comprises:
  - a first internal metal member in the first groove, and
  - a second internal metal member in the second groove; and
- the second groove includes a portion overlapping with the first groove in a plan view and communicates with the first groove.

\* \* \* \* \*